United States Patent [19]
Rawles et al.

[11] Patent Number: 6,067,052
[45] Date of Patent: May 23, 2000

[54] LOOP ANTENNA CONFIGURATION FOR PRINTED WIRE BOARD APPLICATIONS

[75] Inventors: Michael S. Rawles, Acworth, Ga.; Cuong Tran, Howell, N.J.

[73] Assignee: Lucent Technologies Inc., Murray Hill, N.J.

[21] Appl. No.: 09/156,929

[22] Filed: Sep. 18, 1998

[51] Int. Cl.[7] .................................................. H01Q 11/12
[52] U.S. Cl. ........................... 343/741; 343/860; 343/866
[58] Field of Search .................... 343/741, 702, 343/742, 744, 713, 866, 867, 868, 855, 860; 333/24 C, 32, 17.3

[56] References Cited

U.S. PATENT DOCUMENTS

| | | | |
|---|---|---|---|
| 5,072,233 | 12/1991 | Zanzig | 343/744 |
| 5,422,650 | 6/1995 | Hill | 343/713 |
| 5,659,325 | 8/1997 | Belcher et al. | 343/744 |
| 5,678,347 | 10/1997 | Terashima et al. | 343/741 |
| 5,719,585 | 2/1998 | Tabata et al. | 343/713 |
| 5,847,683 | 12/1998 | Wolfe et al. | 343/866 |

OTHER PUBLICATIONS

R.C. Johnson and H. Jasik, Antenna Engineering Handbook, Chaps. 5 & 7, McGraw Hill (2d ed. 1984).

J.R. James and P.S. Hall, Handbook of Microstrip Antennas, Chap. 5 (Peregrinus 1989).

*Primary Examiner*—Don Wong
*Assistant Examiner*—Tan Ho

[57] ABSTRACT

A loop antenna includes a dielectric substrate, and an antenna conductor forming a loop that extends over a surface of the substrate. A matching circuit near the conductor is dimensioned and arranged for electromagnetically coupling a radio frequency circuit with the antenna conductor. In one embodiment, the antenna conductor forms a closed loop on a surface of a first substrate layer, and the matching network includes a strip transmission line on a surface of a second substrate layer overlying the antenna conductor on the first substrate layer. The substrate layers form part of an interface unit that provides a wireless data link with a residential electric utility meter.

16 Claims, 8 Drawing Sheets

LOOP ANTENNA CONFIGURATION FOR PRINTED WIRE BOARD APPLICATIONS

BACKGROUND OF THE INVENTION

1. Field of the Invention

This invention relates generally to loop antennas, and particularly to a loop antenna configuration suitable for printed wire board applications.

2. Discussion of the Known Art

Loop antennas are generally known, and are often used for purposes of radio direction finding (RDF). See generally, R. C. Johnson and H. Jasik, Antenna Engineering Handbook, Chap. 5, McGraw Hill (2d ed. 1984). Printed wire or "microstrip" antennas are also known, wherein a rectangular conductive antenna element, or pair of elements (dipoles), are formed on a substrate of dielectric material. An associated matching network couples the antenna elements with a radio frequency (RF) circuit, also on the substrate. Id., Chap. 7. See also J. R. James and P. S. Hall, Handbook of Microstrip Antennas, Chap. 5 (Peregrinus 1989). Loop antennas are not known to be commonly used in printed wire form on a dielectric substrate, however.

SUMMARY OF THE INVENTION

A loop antenna configuration is provided that is suitable for printed wire board applications.

According to the invention, a loop antenna includes a substrate of dielectric material, and an antenna conductor forming a loop that extends over a surface of the substrate. A matching circuit in the vicinity of the antenna conductor is dimensioned and arranged for coupling a radio frequency circuit electromagnetically with the antenna conductor.

For a better understanding of the present invention, reference is made to the following description taken in conjunction with the accompanying drawing and the appended claims.

DETAILED DESCRIPTION OF THE INVENTION

Figure 1:
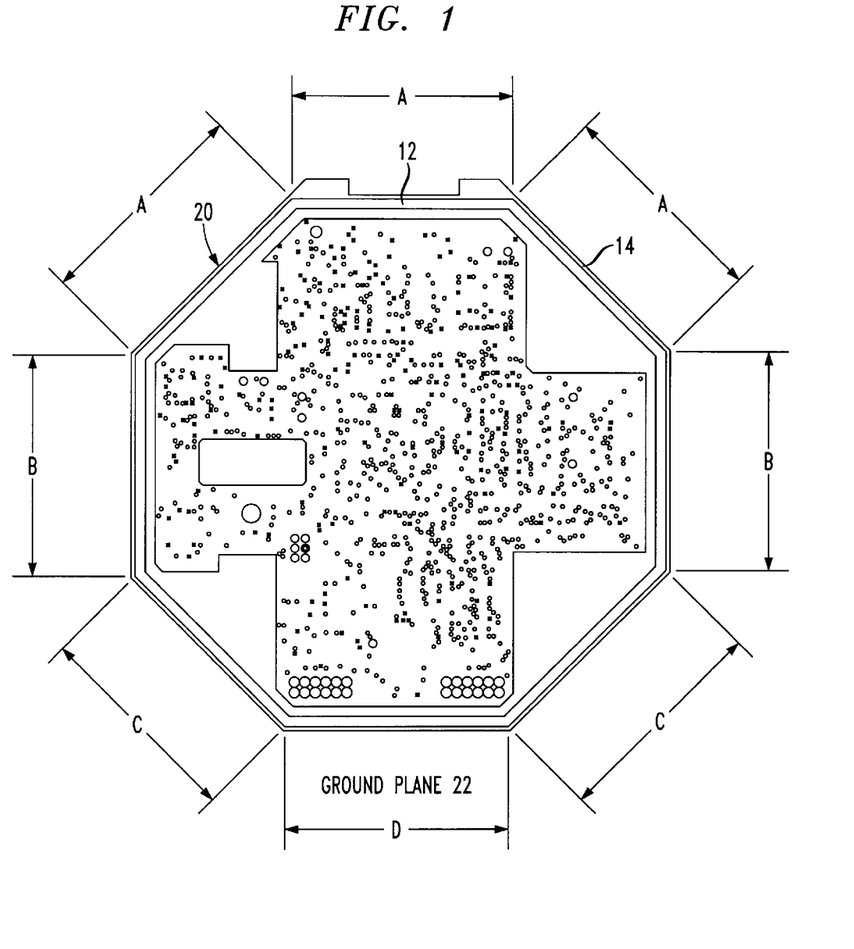
FIG. 1 is a plan view of a loop antenna conductor on a substrate layer of a multi-layer printed wire board.

FIG. 1 is a plan view of a loop antenna conductor 12 that is printed, deposited or otherwise adhered on a major surface of a generally planar substrate layer 14. In the illustrated embodiment, the substrate layer 14 is a middle layer of a three-layer printed wire board 20 having a generally octagonal periphery. The antenna conductor 12 is, for example, a 100 micron ($\mu$) thick copper strip forming a closed loop having straight sections that run closely adjacent to corresponding edges of the substrate layer 14, as shown. All layers of the printed wire board 20 may be made, for example, from type FR 4 material having a dielectric permittivity (e) of about 4.7.

As described in further detail below, the conductor 12 acts as a loop antenna having a near omni-directional pattern in a horizontal plane perpendicular to the substrate layer 14, over a frequency range of, for example, about 902 to 928 MHz when the straight sections of the conductor 12 are dimensioned as follows (see FIG. 1):

Dimension A: 2.140 inches

Dimension B: 2.200 inches

Dimension C: 2.105 inches

Dimension D: 2.195 inches

Figure 2:
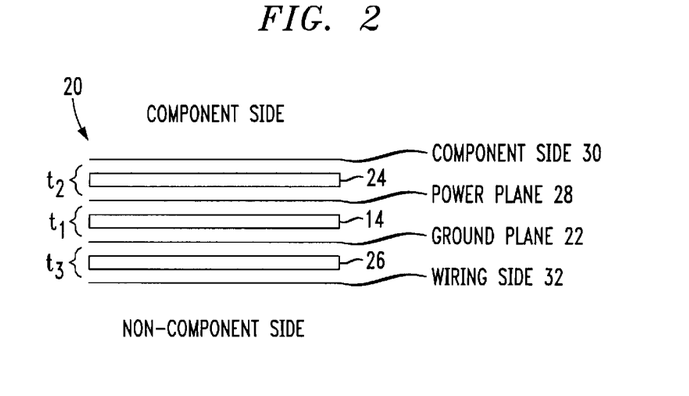
FIG. 2 is an exploded, side view showing substrate layers of the printed wire board in FIG. 1.

FIG. 2 is an exploded view of the three layers forming the printed wire board 20, including the middle substrate layer 14 in FIG. 1. The layer 14 has a thickness $t_1$ of about 0.032 inches. A bottom surface of the substrate 14 as viewed in FIG. 2 and which is shown in FIG. 1, defines a ground plane 22 of the wire board 20. Areas inside the boundary of the antenna conductor 12 may have relatively large deposits of copper which provide a common ground potential for terminals of components mounted atop the board 20. Such copper ground areas are spaced apart from the antenna conductor 12 by no less than, e.g., about 0.100 inches at regions where the ground areas approach the conductor 12. That is, the antenna conductor 12 is kept out of direct contact with all other metallic deposits and terminals on or within the layered wire board 20.

The wire board 20 also has an upper dielectric substrate layer 24, and a lower dielectric substrate layer 26, as seen in FIG. 2. In the present embodiment, the upper layer 24 has a thickness $t_2$ of about 0.012 inches, and the lower layer 26 has a thickness $t_3$ also of about 0.012 inches. A bottom surface of the upper layer 24 defines a power plane 28. The plane 28 contains a number of printed wire traces for conducting operating voltages to components mounted atop the upper layer 24 on a component side 30. A bottom surface of the lower layer 26 defines a wiring side 32 which includes a number of printed wire traces for interconnecting terminals of the various components mounted on the component side 30 of the wire board 20.

Figure 3:
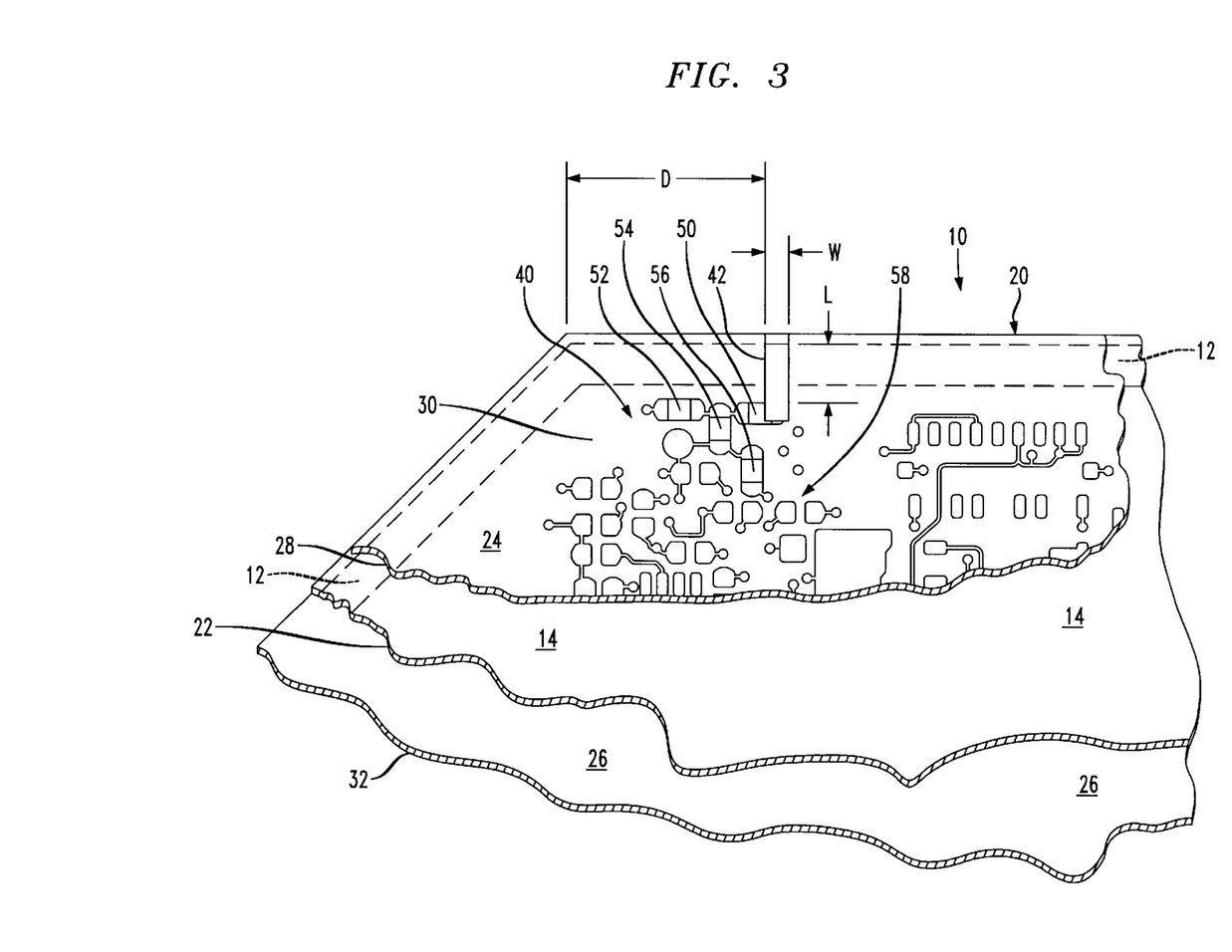
FIG. 3 is a plan view of portions of the substrate layers, showing an antenna matching circuit on a surface of one of the layers.
Figure 4:
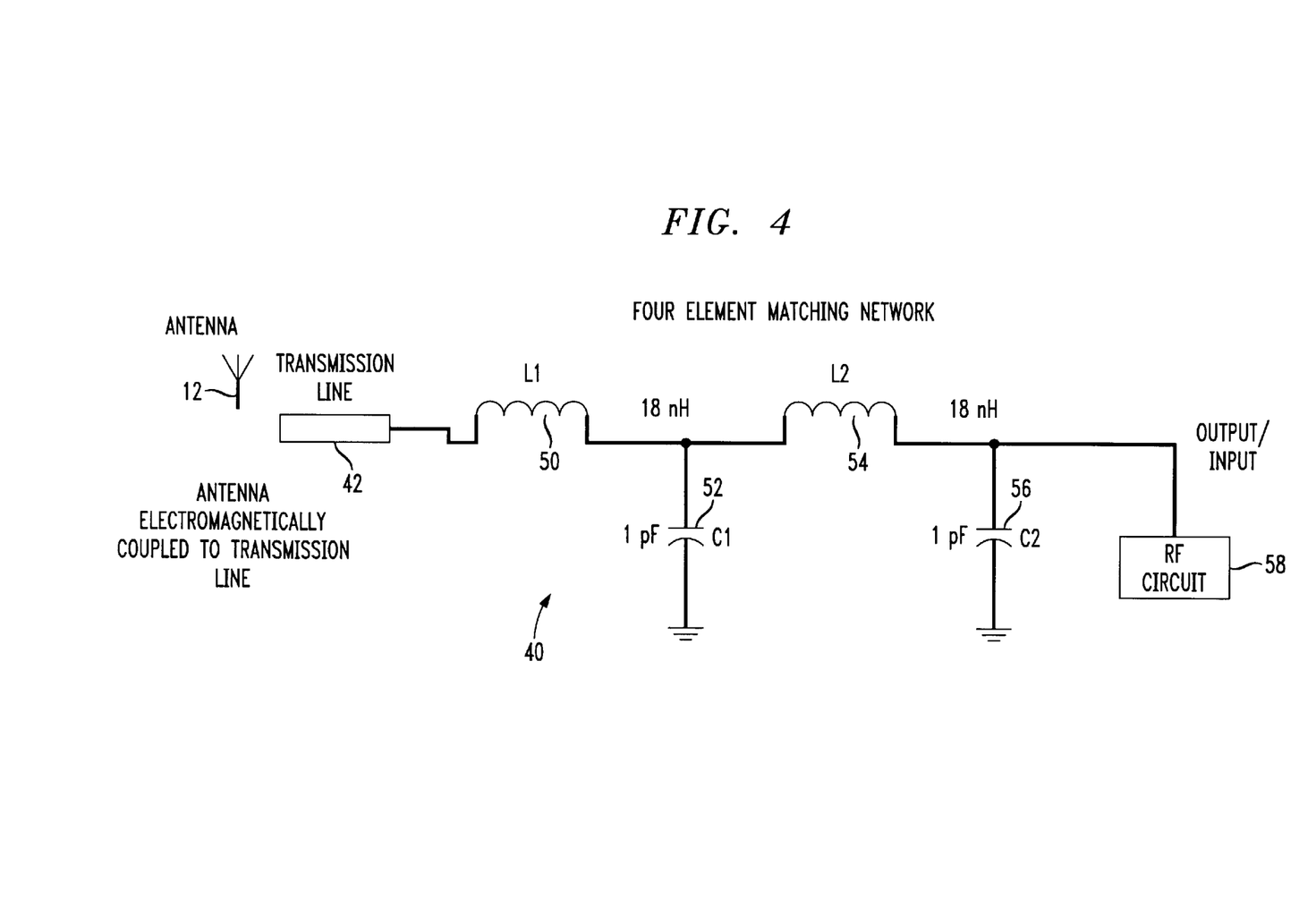
FIG. 4 is an electrical schematic diagram of the matching circuit in FIG. 3.

FIG. 3 is a plan view of portions of the upper, middle and lower dielectric substrate layers 24, 14 and 26, in FIG. 2, showing components of a matching circuit 40 on the component side 30 of the upper layer 24. FIG. 4 is an electrical schematic diagram of the matching circuit 40 in FIG. 3.

The matching circuit 40 includes a conductive (e.g., copper) strip transmission line 42 having a width W of, for example, 0.075 inches and a length L of 0.200 inches. The length of the transmission line 42 traverses and is substantially perpendicular to a straight section of the antenna conductor 12 on the ground plane side of the middle layer 14. The separation distance between the strip transmission line 42 and the plane of the antenna conductor 12, is thus the sum of the thicknesses of layers 24 and 14, i.e., 0.012 inches +0.032 inches=0.044 inches (44 mils).

Matching circuit 40 includes a first inductor 50 which may be in the form of a surface mountable chip having a value of, e.g., 18 nanohenries (nH). The chip may be a commercially available one, for example, type TOKO LL2012-F18NK. Matching circuit 40 also includes a first capacitor 52 which may also be in the form of a surface mountable chip having a value of 1 picofarad (pF), for example, Murata GRM39COG010C100. Matching circuit 40 also has a second inductor 54 of the same value and kind as the first inductor 50, and a second capacitor 56 of the same value and kind as the first capacitor 52. The inductors 50, 54; and the capacitors 52, 56; are connected to one another and to the transmission line 42 in a so-called "pi-L" configuration shown in FIG. 4.

As mentioned, the strip transmission line 42 is not directly connected to the antenna conductor 12, but remains separated from the antenna conductor by the dielectric substrate layers 24 and 14. In the illustrated embodiment, the left edge of the transmission line 42 as viewed in FIG. 3, is located a distance D of about 0.485 inches from a nearest end of a straight section of the antenna conductor 12 on middle layer 14. The matching circuit 40 operates to match a single-ended output or input of a radio frequency (RF) circuit 58 (FIG. 4) on the component side 30 of layer 24, to the loop antenna conductor 12 on layer 14 over an effective operating range of 902 to 928 MHz, when using component values and dimensions specified herein.

Conventionally, loop antennas are driven with balanced, parallel two-wire transmission lines. The loop antenna conductor 12 is closed, however, thus precluding conventional coupling at an open feed point along the conductor with a balanced transmission line. It was discovered that the closed conductor 12 can act as an effective loop antenna by electromagnetically coupling the RF circuit 58 to the conductor 12 through the dielectric material layers of the printed wire board 20, using the strip transmission line 42 from the single-ended (unbalanced) matching network 40. When compared with other printed antennas, the disclosed loop antenna configuration provided the best near omni pattern when tested in an application detailed further below.

Typical applications for a loop antenna configuration the same or equivalent to that of the presently disclosed one include, for example;

Energy Management—gas meters, electric meters, water meters, load controls, thermostats;

Consumer Electronics—televisions, personal computers, video, audio, appliances, CATV, telephones;

Security—alarm systems and smoke detectors.

Figure 5:
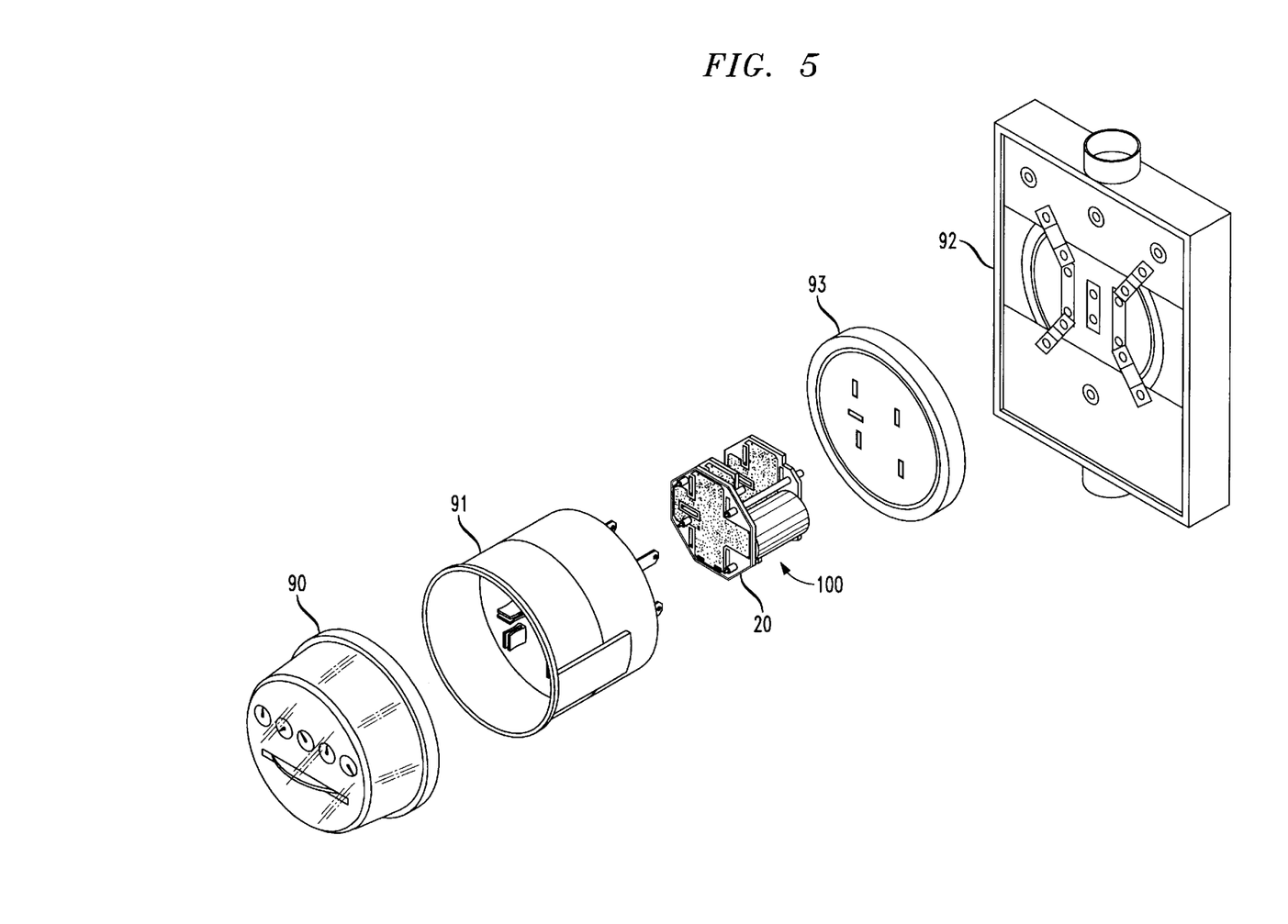
FIGS. 5 and 6 show a utility interface unit including the printed wire board of FIGS. 1–3, being assembled inside an electric utility meter housing.
Figure 6:
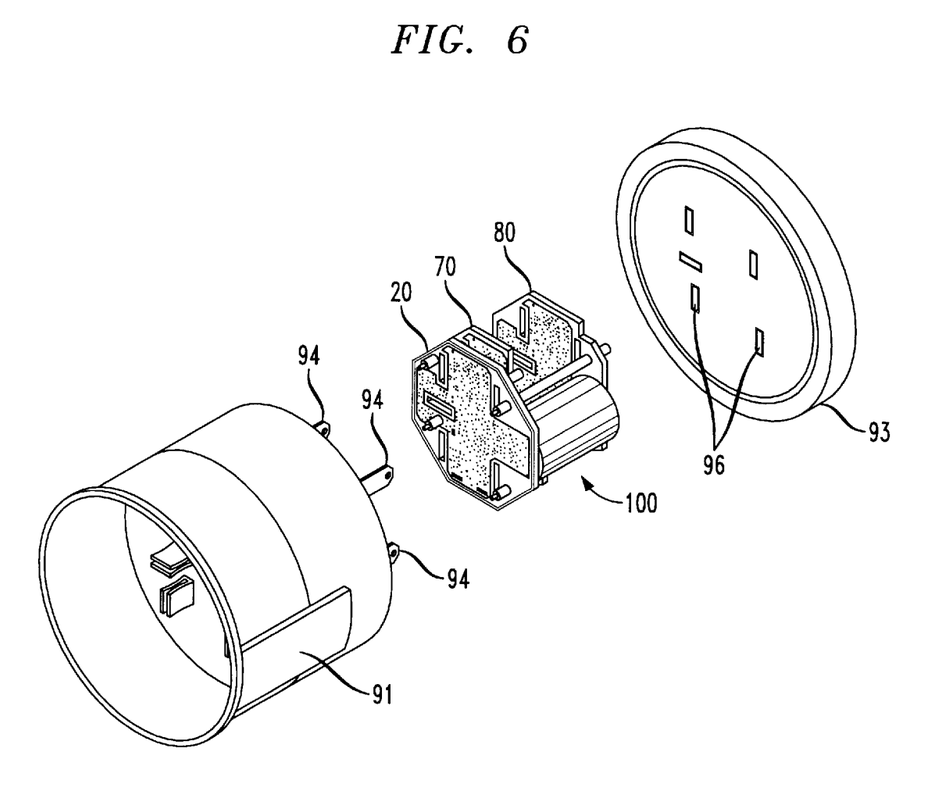

FIGS. 5 and 6 show the layered printed wire board 20 being mounted with two other printed wire boards 70, 80 within a housing assembly for an electric utility meter 90. In the application of FIGS. 5 and 6, the printed wire board 20 forms part of a utility interface unit (UIU) 100 that is located between the utility meter 90 and a meter mounting pan 92 (FIG. 5). The UIU 100 is itself supported inside a cylindrical plastics housing 91 having a circular plastics end cover 93. UIU 100 is intended to transmit and receive data corresponding to a homeowner's electric power consumption, on an interactive basis with the homeowner and the serving utility company, using both wired and wireless transmission paths. Wireless communication of data with the UIU 100 requires the UIU to have, for example, a modem, a wireless transceiver, and a suitable antenna. Several antennas were tested for suitability, including the disclosed loop configuration.

Five metal power blades 94 extend from the meter 90 and pass through slot openings in the UIU boards, to connect to blade slot terminals 96 in the meter pan 92. When assembled in the housing 91, the UIU 100 is located close to the meter 90 and the meter mounting pan 92 both of which have metallic components. As detailed below, the present loop antenna configuration provides a near omni-directional pattern, even in the presence of closely mounted metal components and high electric current drawn through the meter blades 94.

Radio frequency system requirements for an antenna for the UIU 100, call for a near omnidirectional antenna pattern in a horizontal (azimuth) plane, over the mentioned operating frequency range. In addition to the present loop configuration, a printed dipole, a printed monopole, and a low profile inverted-F were separately evaluated. It was found that for all antennas other than the loop configuration, near omni coverage could not be obtained due to the location of the UIU 100 between the electric meter 90 and the meter pan 92.

Test Procedure

A prototype UIU 100 including three printed wire boards for carrying, respectively, a central processor unit (CPU), a modem, and a power supply; was assembled into a Marwell collar mount enclosure. The antenna under evaluation was printed on the CPU wire board, which board corresponds to the wire board 20 for the disclosed loop antenna configuration. Preliminary testing of each of the antennas was performed in an anechoic chamber. The chamber setup included a Gas Meter Encoder (GME) antenna as a source, set to transmit a test signal at 915 MHz, and the collar-mount UIU 100 mounted between an 8.5"×11" meter pan 92 and the electric power meter 90. RF power measurements were taken using a Hewlett Packard 436A power meter connected directly to an antenna port.

The first step in the test procedure was to obtain a reference for gain measurements. This was accomplished by mounting a reference antenna with a known gain of 3 dBi in the position that the UIU 100 would be mounted. The reference antenna power level was measured from 0° to 355° in 5° increments azimuth, and at 0° elevation. Azimuth antenna patterns at 0° elevation, referenced to the 3 dBi omni antenna, were then taken wherein a 0° azimuth position corresponded to the source facing directly toward the front of the electric meter. The electric meter 90, UIU 100 and meter pan 92 were rotated in a clockwise direction while the source remained stationary at 0°. Based on the test results, it was found that for a printed monopole, a printed dipole, and a low profile inverted-F, the electric meter 90 and the meter pan 92 significantly altered the patterns of those antennas from what would be obtained in a "free space" environment.

Figure 7:
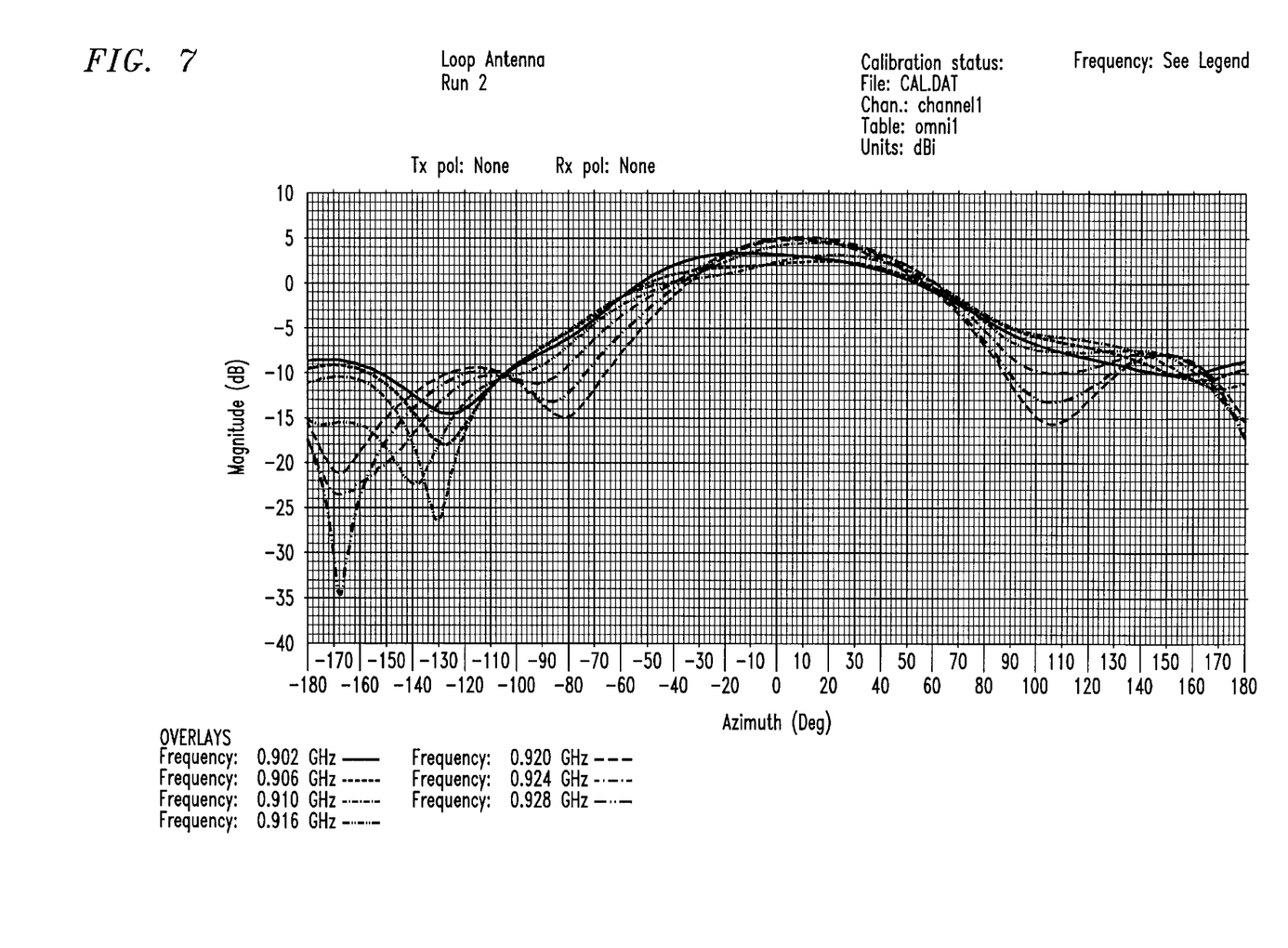
FIGS. 7 and 8 are antenna patterns for a printed loop antenna configuration including the loop antenna conductor of FIG. 1 and the matching circuit of FIGS. 3 and 4.
Figure 8:
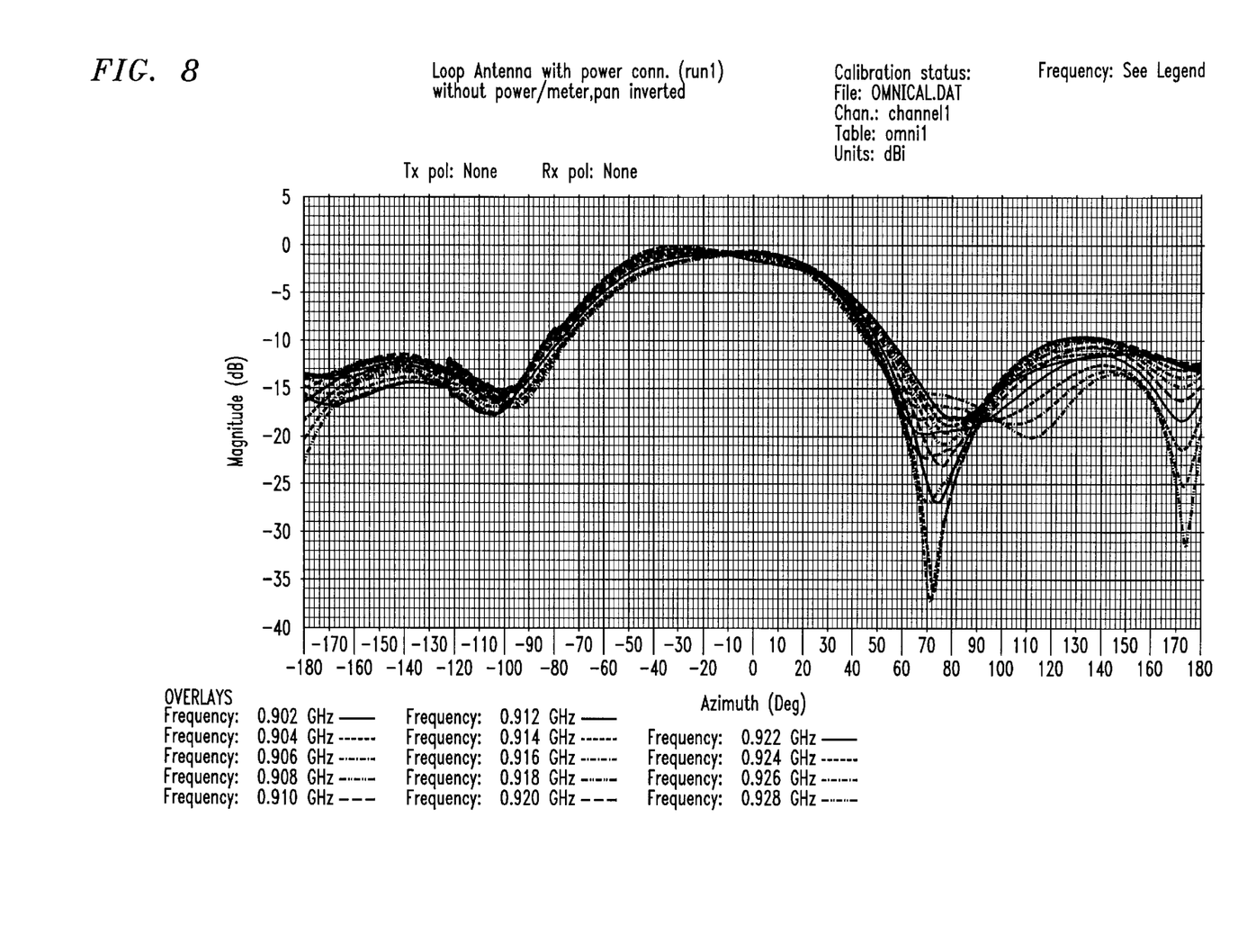

FIGS. 7 and 8 show patterns for the present loop antenna configuration, taken with a type FR959 automated antenna measurement system. FIG. 7 reveals that the configuration yields a positive gain over 100° in azimuth (from −40° to 60°). The pattern is one that would be expected for a loop antenna in a free-space environment, meaning that the performance of the configuration was substantially unaffected by the metallic electric meter 90 and meter pan 92 closely surrounding the UIU 100.

FIG. 8 shows the pattern obtained for the present antenna configuration with large current being drawn through the blades 94 extending through slots in the printed wire CPU board 20. The test chamber set up was the same as for the previous pattern measurements, with the addition of a two-phase power connection entering the top of the meter pan 92 and a single phase outlet connected to the meter pan to allow for load connections. Two loads were placed on the meter 90, viz., a space heater and a wall air-conditioning unit (not shown), with an estimated current draw of 20 amps. While noise was noticeably coupled into the pattern for the monopole antenna, FIG. 8 for the loop antenna configuration shows virtually no coupling of noise from such a current source, or any alteration of its "no-load" antenna pattern.

Figure 9:
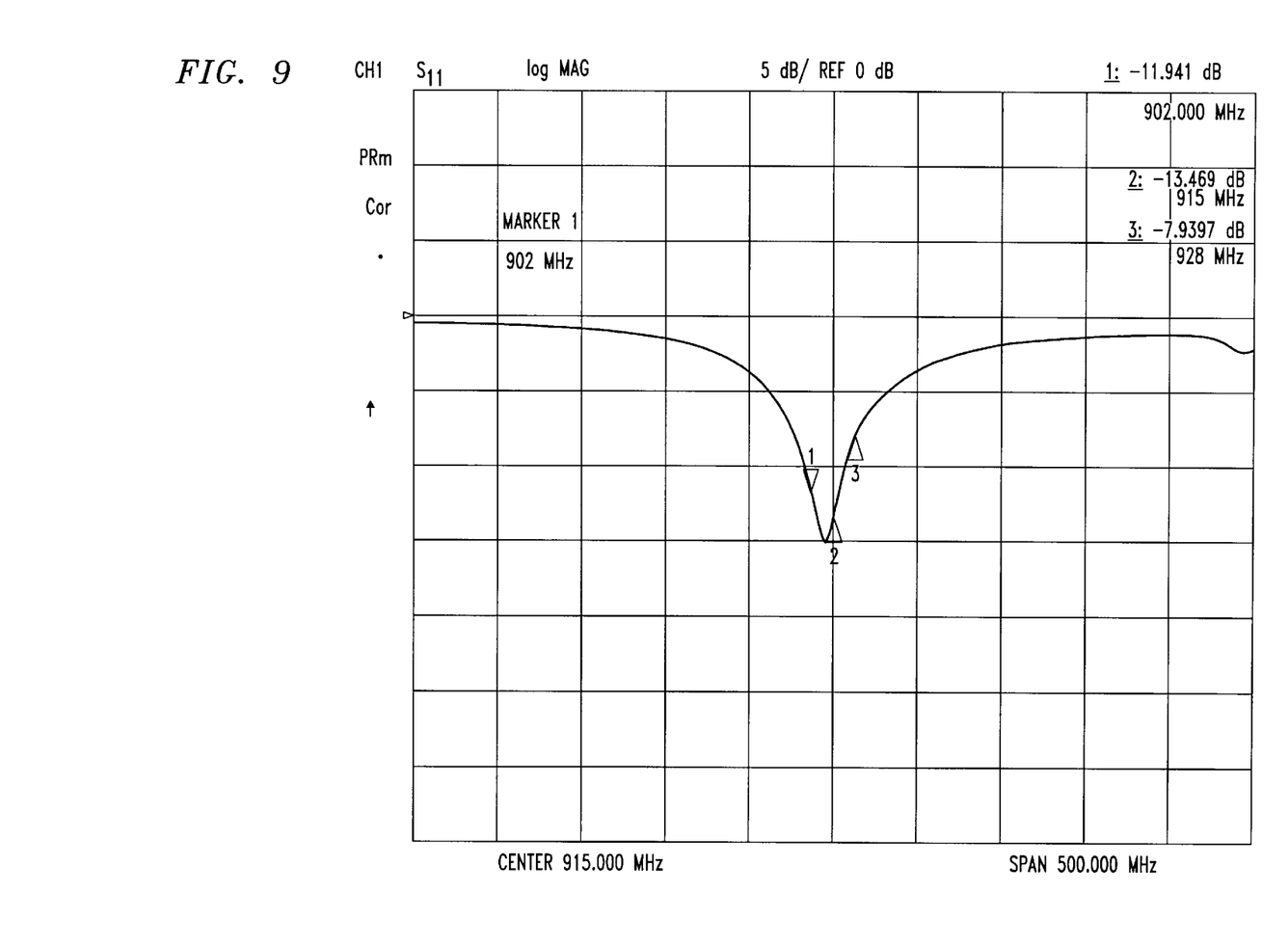
FIG. 9 is a plot of an S-parameter measurement taken at an output/input node of the matching circuit over a desired RF band.

FIG. 9 is a plot of an S11 log magnitude measurement of the present loop configuration, taken at the output/input node of the matching circuit 40 (FIG. 4) using a Hewlett Packard 8753E network analyzer. The printed wire board 20 containing the configuration was assembled as above to form part of the UIU 100, and the UIU was contained between the electric power meter 90 and meter pan 92. Markers 1, 2 and 3 on the plot correspond to measurement frequencies of 902, 915 and 928 MHz, yielding corresponding log magnitude measurements of −11.941; −13.469; and −7.9397 dB relative to a 0 dB base line. The measurements confirm an effective operating bandwidth of 26 MHz for the disclosed printed loop configuration.

While the foregoing description represents a preferred embodiment of the invention, it will be obvious to those skilled in the art that various changes and modifications may be made, without departing from the spirit and scope of the invention pointed out by the following claims.

We claim:

1. A loop antenna, comprising:
    a first substrate layer of dielectric material;
    an antenna conductor forming a loop that extends over a surface of the substrate layer;
    a matching circuit in the vicinity of the antenna conductor, wherein the matching circuit is dimensioned and arranged for electromagnetically coupling a radio frequency circuit with the antenna conductor; and
    a second substrate layer overlying the first substrate layer, and the matching circuit is arranged on the second substrate layer.

2. A loop antenna according to claim 1, wherein the antenna conductor forms a closed loop.

3. A loop antenna according to claim 2, wherein the antenna conductor has a generally polygonal configuration.

4. A loop antenna according to claim 3, wherein the antenna conductor has a generally octagonal configuration.

5. A loop antenna according to claim 1, wherein the matching circuit includes a strip transmission line.

6. A loop antenna, comprising:
    a first substrate layer of dielectric material;
    an antenna conductor forming a loop that extends over a surface of the first substrate layer; and
    a matching circuit in the vicinity of the antenna conductor, wherein the matching circuit is dimensioned and arranged for electromagnetically coupling a radio frequency circuit with the antenna conductor;
    wherein the matching circuit includes a strip transmission line that extends over a portion of the antenna conductor and is spaced a certain distance from said conductor.

7. A loop antenna according to claim 6, including a second substrate layer overlying the first substrate layer, the matching circuit is arranged on the second substrate layer, and said certain distance corresponds to a sum of thicknesses of the first and the second substrate layers.

8. A wireless interface unit, comprising:
    a housing constructed and arranged to be supported in the region of a device to or from which information is to be communicated via a wireless link;
    a communications unit mounted inside the housing, said communications unit including a loop antenna comprising;
    a first substrate layer of dielectric material;
    an antenna conductor forming a loop that extends over a surface of the substrate layer; and
    a matching circuit in the vicinity of the antenna conductor, wherein the matching circuit is dimensioned and arranged for electromagnetically coupling a radio frequency circuit with the antenna conductor; and
    a second substrate layer overlying the first substrate layer, and the matching circuit is arranged on the second substrate layer.

9. A wireless interface unit according to claim 8, wherein the antenna conductor forms a closed loop.

10. A wireless interface unit according to claim 9, wherein the antenna conductor has a generally polygonal configuration.

11. A wireless interface unit according to claim 10, wherein the antenna conductor has a generally octagonal configuration.

12. A wireless interface unit according to claim 8, wherein the matching circuit includes a strip transmission line.

13. A wireless interface unit according to claim 8, wherein said housing is constructed and arranged to be supported in the region of an electric utility meter.

14. A wireless interface unit according to claim 13, wherein said first substrate layer has slots for accommodating a number of blades extending from the electric utility meter, said slots being located inside the periphery of the antenna conductor forming said loop.

15. A wireless interface unit, comprising
    a housing constructed and arranged to be supported in the region of a device to or from which information is to be communicated via a wireless link;
    a communications unit mounted inside the housing, said communications unit including a loop antenna comprising
    a first substrate layer of dielectric material;
    an antenna conductor forming a loop that extends over a surface of the substrate layer; and
    a matching circuit in the vicinity of the antenna conductor, wherein the matching circuit is dimensioned and arranged for electromagnetically coupling a radio frequency circuit with the antenna conductor; and
    wherein the matching circuit includes a strip transmission line that extends over a portion of the antenna conductor and is spaced a certain distance from said conductor.

16. A wireless interface unit according to claim 15, including a second substrate layer overlying the first substrate layer, the matching circuit is arranged on the second substrate layer, and said certain distance corresponds to a sum of thicknesses of the first and the second substrate layers.

* * * * *